(12) United States Patent
Gilbert

(10) Patent No.: US 9,397,625 B1
(45) Date of Patent: Jul. 19, 2016

(54) INSTRUMENTATION LOG AMP WITH MULTIPLEXED INPUTS

(71) Applicant: Analog Devices, Inc., Norwood, MA (US)

(72) Inventor: Barrie Gilbert, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/702,982

(22) Filed: May 4, 2015

(51) Int. Cl.
*H03F 3/68* (2006.01)
*H03F 3/08* (2006.01)

(52) U.S. Cl.
CPC .. *H03F 3/68* (2013.01); *H03F 3/08* (2013.01); *H03F 2200/261* (2013.01)

(58) Field of Classification Search
USPC ............................ 330/295, 124 R, 84, 286, 53
See application file for complete search history.

(56) References Cited

U.S. PATENT DOCUMENTS

| | | | |
|---|---|---|---|
| 6,750,953 B1* | 6/2004 | Douglas | G01C 15/006 250/208.5 |
| 2007/0086311 A1* | 4/2007 | Higashiyama | G11B 7/126 369/120 |
| 2008/0129369 A1* | 6/2008 | Ivancevic | H03K 17/005 327/410 |

* cited by examiner

*Primary Examiner* — Hieu Nguyen
(74) *Attorney, Agent, or Firm* — Patent Capital Group

(57) ABSTRACT

A device has at least two current mode logarithmic amplifiers having currents as their inputs, and multiplexing logic electrically connected to outputs of the current mode logarithmic amplifiers to select one of the current mode amplifiers to produce an output signal.

19 Claims, 6 Drawing Sheets

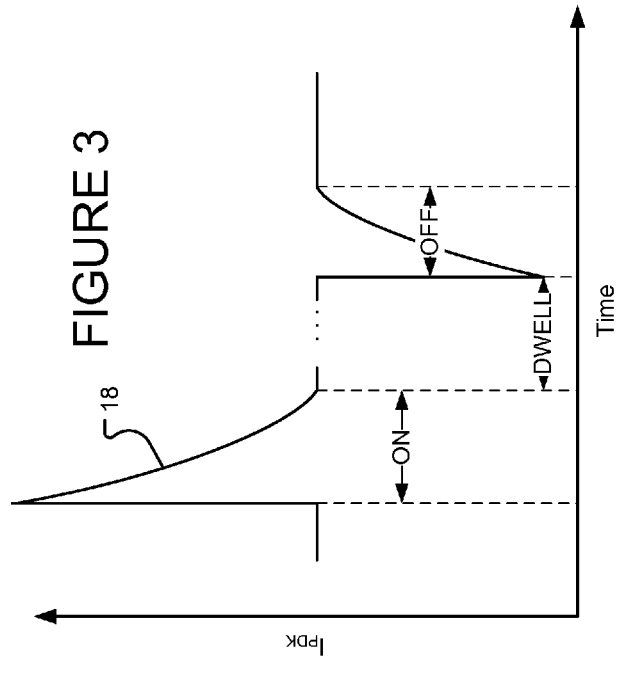
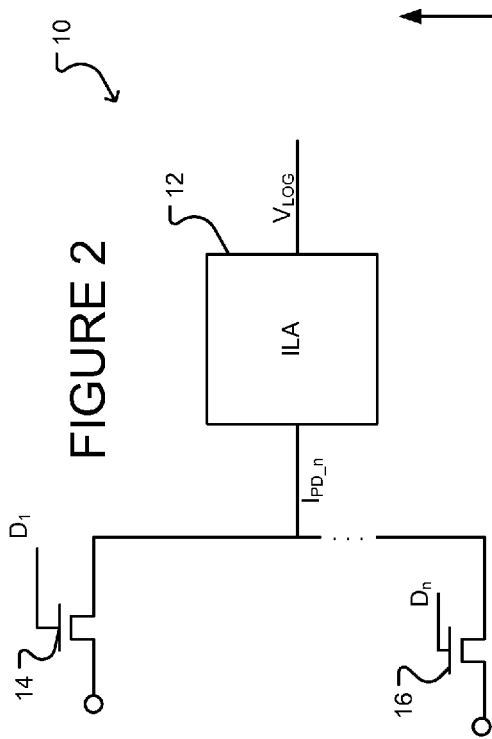

US 9,397,625 B1

INSTRUMENTATION LOG AMP WITH MULTIPLEXED INPUTS

BACKGROUND

A current-mode logarithmic amplifier (log amp) receives current inputs at a node held close to a defined potential and processes them so as to generate an output voltage that is proportional to the decibel-scaled magnitude of such currents. To help in differentiating this type of log amp from other types, such as RF log amps based on entirely different principles, this type is identified as an Instrumentation Log Amp (ILA). These are usually, though not necessarily, fabricated in monolithic form.

In common application of an ILA, the current in a photodiode coupled to an optical data fiber is accepted and this generates a logarithmically-scaled output, indicating the optical power in the fiber. In general, the photodiode current may be as small as 10 pA ($10^{-11}$ A) and as large as 10 mA ($10^{-2}$ A), corresponding to a decibel range of $20 \log_{10}(10^9)=180$ dB. This is why logarithmic compression is an essential and integral aspect of the function of a high-performance ILA.

There is a need for ILAs that provide more complex operations, one of which is the management of a large number of input channels. That is, monolithic solutions having the capability of multiplexing a large number of input channels are needed, while keeping down the cost and the required space on a printed-circuit board, relative to using a single ILA per channel.

FIG. 1 shows a prior art embodiment of an array of multiplexed instrumentation log amplifiers (ILAs) 10. A set of current source inputs such as 12 provide input signals to an array of instrumentation logarithmic amplifiers such as 14. An array 18 of switches such as 16 multiplex the outputs of the ILAs, meaning that one of the ILA outputs is selected as the input to the analog-to-digital converter 20. This solution does not integrate the ILAs and the multiplexer and does not perform as well as one would like.

However, because these current-mode signals can be so very small, attempts to multiplex the inputs using MOS transistors as switches are fraught with difficulties due to the large relative magnitude of the switching transistors' displacement charges as each channel is selected. These charges are invariably unequal in their positive and negative directions and average out to a net current that may overwhelm in magnitude the signal that is to be measured, when selection is to be made at a satisfactorily high rate.

BRIEF DESCRIPTION OF THE DRAWINGS

FIG. 2 shows an example of multiplexing an ILA on the input side.

FIG. 3 illustrates the asymmetric charges which can be injected into the signal path when uses a MOS switch.

DESCRIPTION OF THE EMBODIMENTS

A high-performance ILA, as exemplified by the Analog Devices ADL5034, provides a wide variety of options, such as several scaling modes, access to a loadable reference voltage, a linear output voltage for photodiode biasing purposes, as well as the ability to operate in a log-ratio mode, that is, to accept both numerator and denominator currents and output a voltage precisely proportional to their ratio.

Several solutions for addressing the multiplexing challenge can be envisaged. In the simplest approach, the ILA's performance is minimized, for example, by providing, fewer operational modes and other options. In particular, considerable simplification can be gained by omitting the log-ratio feature. A gating switch is added after the ILA's internal output node, to remove it from the path to the final output, under logic control. By this means, N such simplified ILAs can multiplex N sources.

A significant advantage of this approach is that each of the N channels are fully settled when selected. This is in strong contrast to the use of multiplexing at the input, which, even if perfect (free from the asymmetric charge injection mentioned above) would seriously disturb the operation of the ILA, especially at low currents, in which region of operation the settling time can amount to many milliseconds, a factor which would greatly reducing the rate at which the several sources can be multiplexed.

Several further extensions of this invention will be described herein. In order to differentiate an ILA which is inherently capable of multiplexing from all the earlier products that are not, the abbreviation MILA (Multiplexing Instrumentation Log Amp) will be used from here forward.

An Instrumentation Logarithmic Amplifier (ILA) accepts a current from a source—frequently but not necessarily a photodiode—at a summing node whose voltage is well-defined and essentially noise-free, and converts this current (which we herein name $I_{PD}$) to a corresponding voltage, having a logarithmic relationship to the current, thus presenting a measurement of current in decibel-scaled form.

Figure 1:
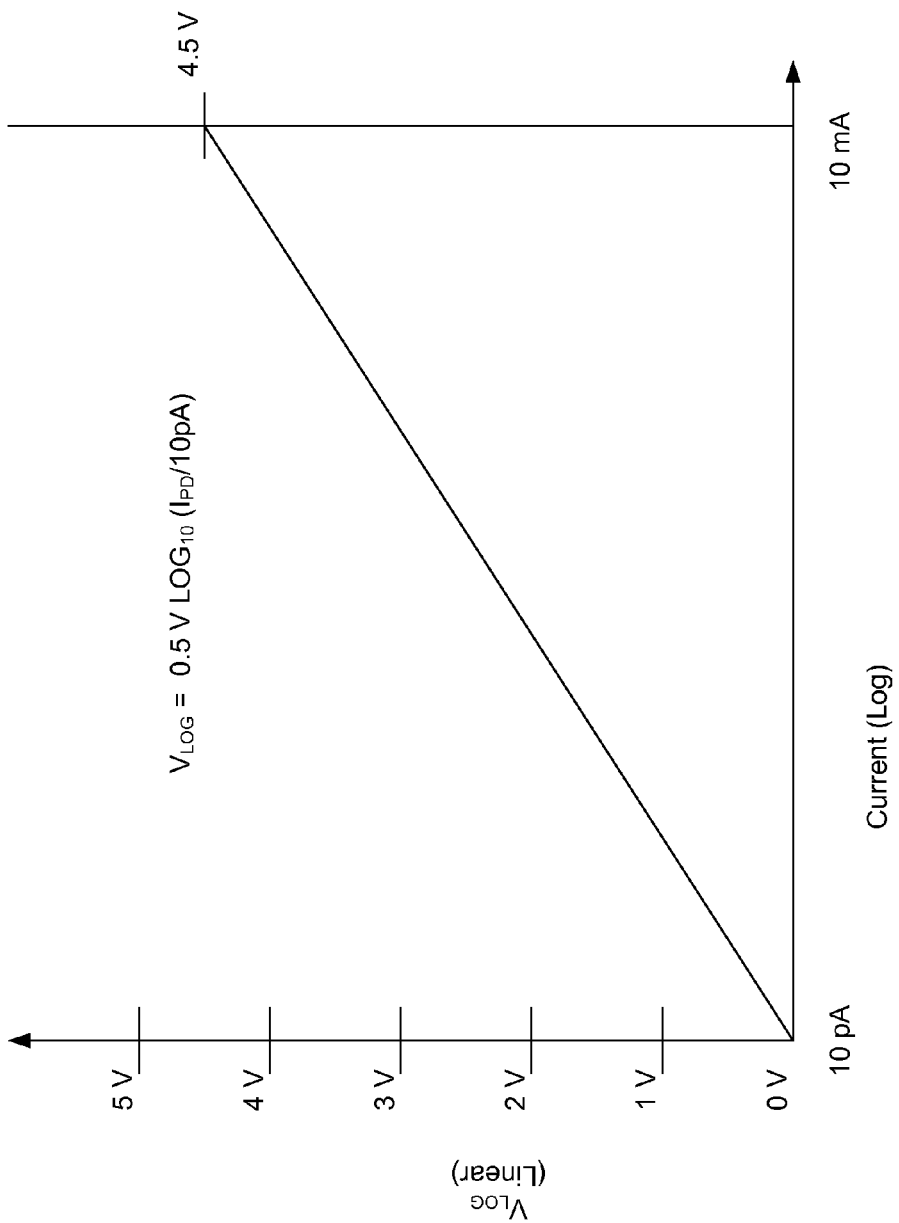
FIG. 1 shows a graph of input current versus output voltage for an instrumentation logarithmic amplifier (ILA).

In a state-of-the-art ILA, the input $I_{PD}$ may range from as little as a few picoamps (pA) to several milliamps (mA), thus corresponding to a very large current ratio. For example, 10 mA/10 pA is one billion, an input dynamic range of 180 decibels (dB). It is this extreme range which raises the necessity of converting the output (which we herein name $V_{LOG}$) in logarithmically-compressed form. FIG. 1 shows an illustrative scaling is as follows: $V_{LOG}=0.5V \log_{10}(I_{PD}/10 \text{ pA})$. Thus, an $I_{PD}$ of 10 pA will generate an output of zero (because $\log_{10}(1)=0$), while an input of 10 mA will generate an output of 4.5V. This choice conveniently corresponds to a decibel scaling factor of 25 mV/dB. (FIG. 1).

Means to multiplex a large number of inputs (N) are not presently available. FIG. 2 shows an alternative scheme that might be considered, using MOS switches. The output ILA 12 is selected by the control of the MOS switch 14. Other ILAs in the chain are similarly selected by their switches. $ILA_n$ would be selected by switch 16. This method is theoretically possible, but it is a poor choice for several reasons. First, it is impracticable to perform high-quality multiplexing directly on the incoming N inputs when the input currents are in the picoamp region due to asymmetric charge displacements in the MOS switches, Second, these transistors must be large enough to exhibit a satisfactorily-low resistance to manage the high-end of the input current range while not greatly affecting the input-summing voltage of a channel, thus exacerbating the problem of charge-related effects. Third, it does not address the problem of managing the settling time (often milliseconds) needed at low currents.

FIG. 3 illustrates the asymmetric charges which can be injected into the signal path, due to the nonlinearity of the gate region in an MOS transistor when used as a switch. If one supposes that the charge spike that occurs at one switching edge is $Q_P$, such as in the ON time, and that which occurs on the other edge is $Q_N$, the net charge difference would amount to $Q_P$-$Q_N$. Now, if the selection pulses occur at a frequency of $f_S$, this charge asymmetry amounts to an average current of $I_Q=(Q_P-Q_N) f_S$. As an illustrative example, let $Q_P$ in a sufficiently large MOS transistor be 3 pC, $Q_N$ be 2 pC and $f_S$ be 10 kHz. This will generate a surprisingly large $I_Q$ of 1 nA—a hundred times greater that the low end of a typical ILA range (10 pA). To put this another way, if the ILA is to maintain an error of 1%, the MOS transistors would have to be 10,000 times smaller. Either that, or the frequency at which channels are selected would need to be only 1 Hz.

The input terminal must be held at a well-defined potential, usually within an error range of under 1 millivolt (mV), independent of the magnitude of the signal current. Typical values provided are zero (ground) and +1V. The summing-node voltage has a subtle but very important effect on the behavior of the photodiode. However, the series resistance of small MOS multiplexing transistors will introduce very significant voltage drops, even at moderate currents, thus altering the effective summing-node potential.

Presented herein are novel structures that avoid the foregoing problems. In all cases, multiplexing is now effected at the outputs of the ILA. The embodiments are of increasing simplification. In this way, the fragile low-level inputs are not corrupted in their measurement, and each of the N front-ends can operate in a fully-settled manner, at a relatively high multiplexing frequency, $f_S$, since the channel selection is performed at a point in the total chain of processing steps at which the signal (now a voltage) is robust.

Figure 4:
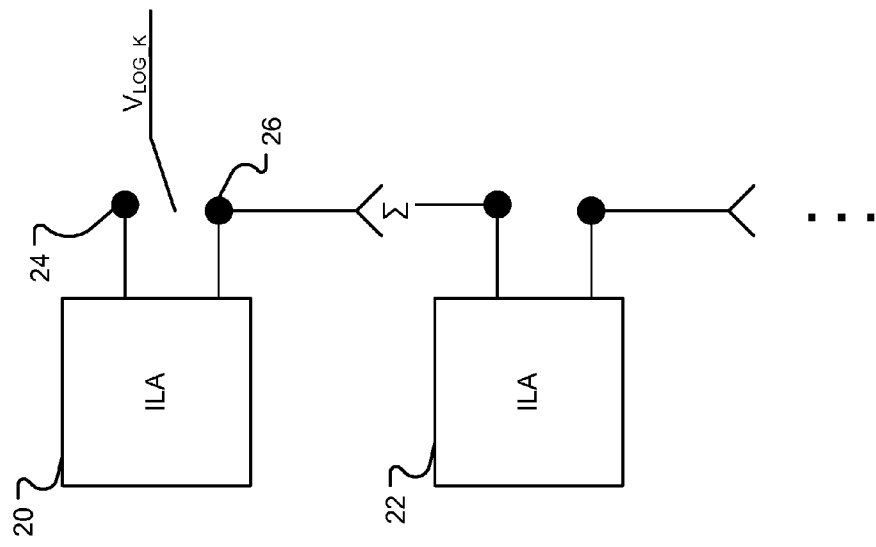
FIG. 4 shows an embodiment of multiplexing ILAs.

The first embodiment, shown in FIG. 4, employs a multiplexing means that allows any number of front-end ILAs to be daisy-chained, that is, certain package pins on the ILA 20 are wired in series. The ILA 20 has a terminal 26 that is wired to the previous ILA in the chain, such as 22. Only one of the front-end outputs can be selected, either the output 26, which comes from the one of the other ILAs in the chain, or the output of the ILA 20.

Figure 5:
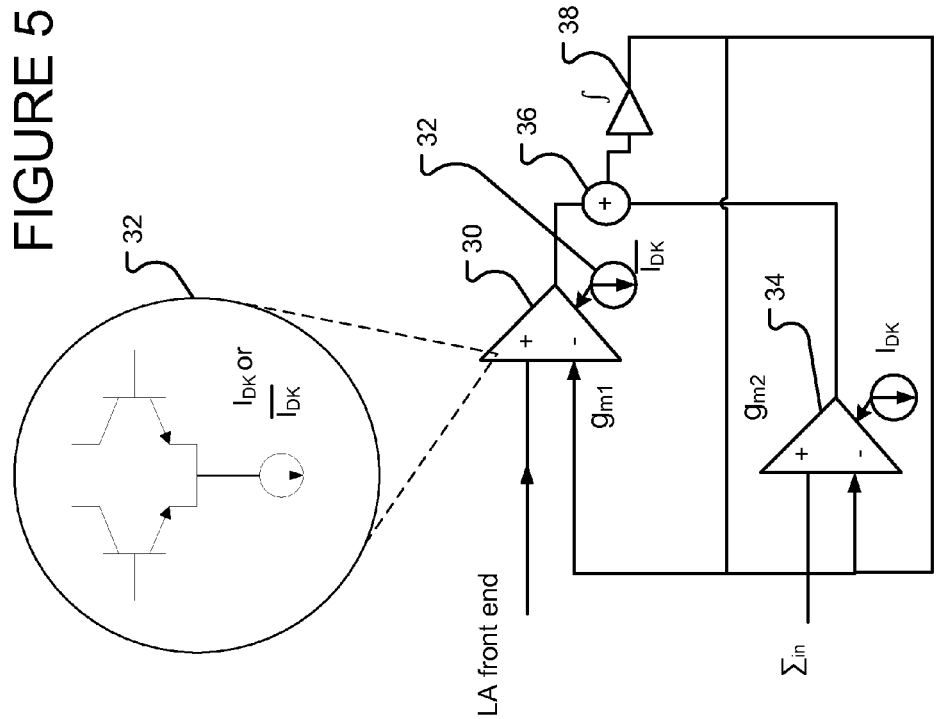
FIG. 5 shows an embodiment of amplifiers used to produce the output signal of an ILA.

As shown in FIG. 5, the output op amp in this case is equipped with two transconductance (gm) cells 30 and 34, one of which, 30, serves the signal from the front-end process while the other, 34, serves a special input: in this case, the input from an adjacent ILA unit also so equipped. Control of the signal path is under the control of one-bit logic input $I_{DK}$. The output is summed at node 36 and buffered on the output by buffer 38.

Figure 6:
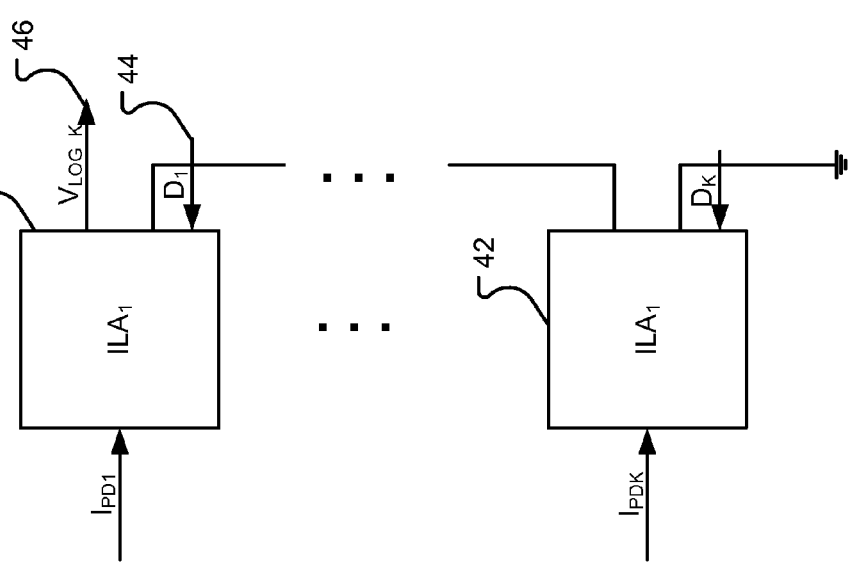
FIG. 6 shows an embodiment of multiplexed ILAs.

FIG. 6 shows how N of these units such as 40 and 42 are chained together. The system design requires that only one unit may be selected at any one time. The control signal D 44, where there are from 1 to K options, selects the unit that will provide the output 46.

Figure 7:
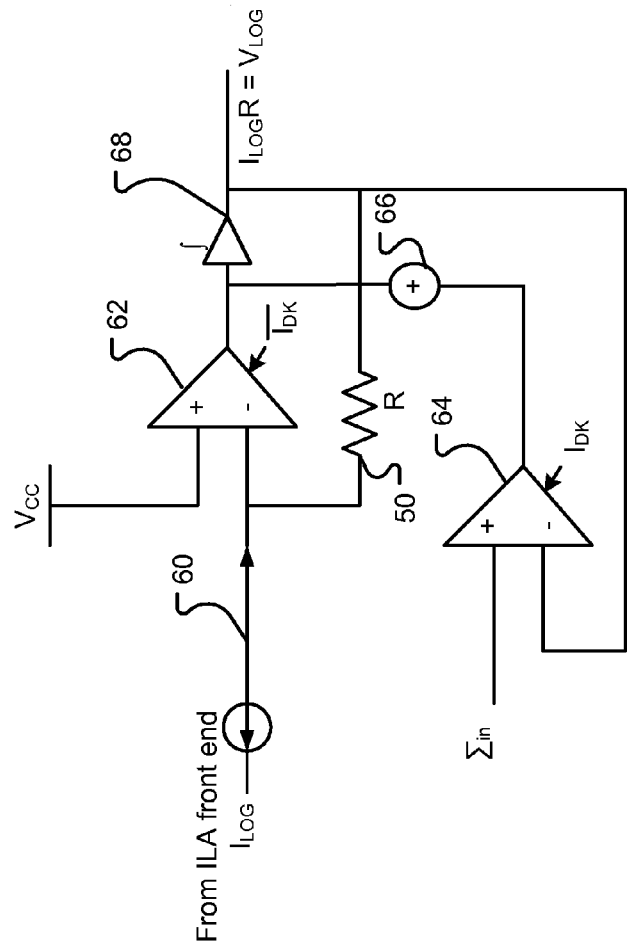
FIG. 7 shows an alternative embodiment of amplifiers used to produce the output signal of an ILA.

A second embodiment, shown in FIG. 7, differs in the logic input that causes the entire output op amp to shut down or power up on demand. The output pin of these units becomes an open-circuit in the first case, or a low-impedance voltage source carrying the input information in second case. The amp 62 has as one input the supply voltage and the other input the output 60 from the ILA front end. The other amp 64 has the summed input from the nearest ILA and the output of the integrating amplifier 68. The resistor 50 provides a voltage output instead of a current output.

This type of output control is sometimes called "tri-stating"—a term inherited from the domain of logic elements whose output may assert either a low state or a high state or become an open-circuit. It is technically incorrect to use this term for the situation presented here, where the output can assert only two states. Nevertheless, in the context of analog circuits it is widely understood in the way used here. This being the mode of operation in the second embodiment, the outputs may now be simply wired directly together. Here again, a logic term is sometimes used to describe such a situation: it is called "wired-OR" connection.

Figure 8:
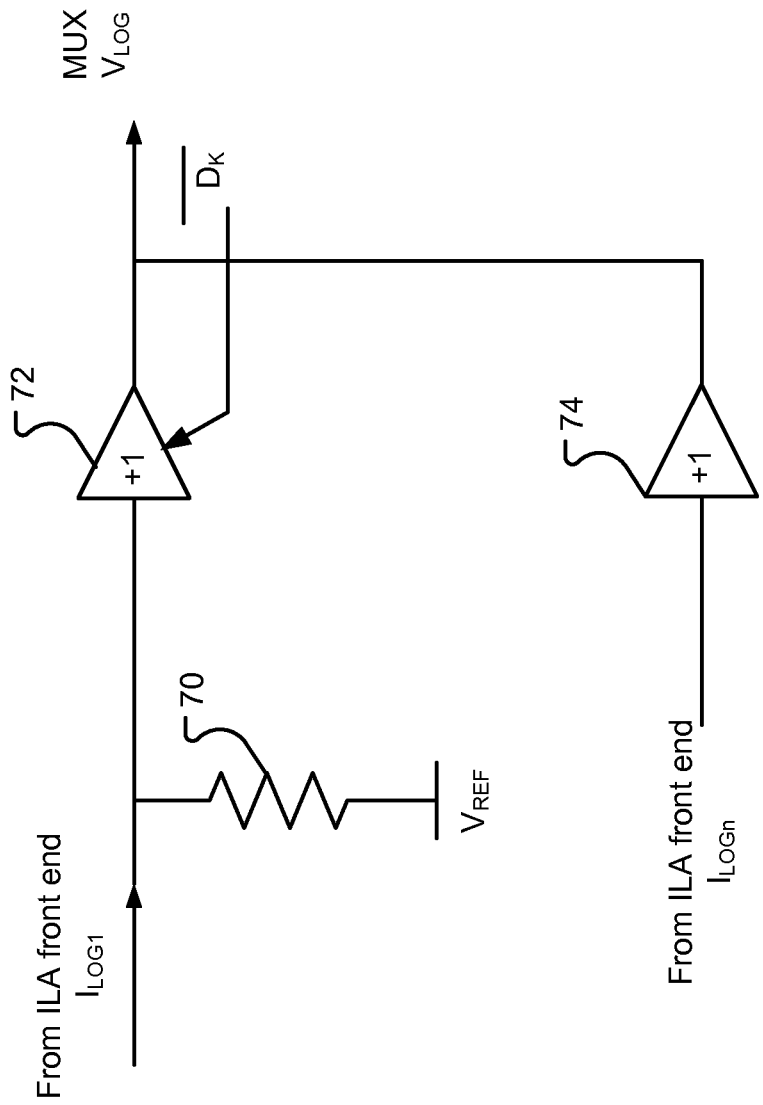
FIG. 8 shows an embodiment of a multiplexed ILA have a wired-OR configuration.

FIG. 8 shows the wiring for several ILA units (each hereinafter named an MILA) multiplexing in this way through buffer amplifiers 72 and 74, etc. There are two main advantages to be gained from this method. One is that the small amount of noise and offset voltage introduced into the daisy-chain of the first scheme is avoided. These small errors arise from the use of a second signal path (via its gm element) at every by-passed unit, which may introduce a significant error in aggregate when many units are operating in this manner. The second is that it is now possible to simultaneously enable any number of units provided that the outputs are summed either by a simple resistor matrix, or by the well-known use of a summing amplifier configuration. A third advantage is that one package pin is saved.

On the other hand, the second method requires significant changes to be made to the design of the output system, since it is important that no internal elements other than the amplifier output can remain connected when a unit is disabled. FIG. 7 showed that feedback resistors were used in the first method to set the scaling of the ILA in a transresistance-style output stage. This is convenient in view of the fact that the stage in an ILA that usually precedes this amplifier produces a current-mode signal of a certain polarity and magnitude and needs to feed into a certain, narrowly constrained, potential at the summing node.

The needed change is shown in FIG. 8 where now, the ILA's intermediate output has to be in the voltage mode, shown in this embodiment as a resistor 70, prior to be delivered to the output when the buffer amplifier such as 72 is enabled. In practice, such a reconfiguration is somewhat more complicated. The current-mode signal is absorbed at a node held at the required potential and delivered to an accurate current mirror, and thence to a load resistor 70, which may be in several sections to allow various scaling options. The voltage on this resistor is then buffered by the tri-stated output amplifier, usually, though not necessarily, having a gain of ×1.

Figure 9:
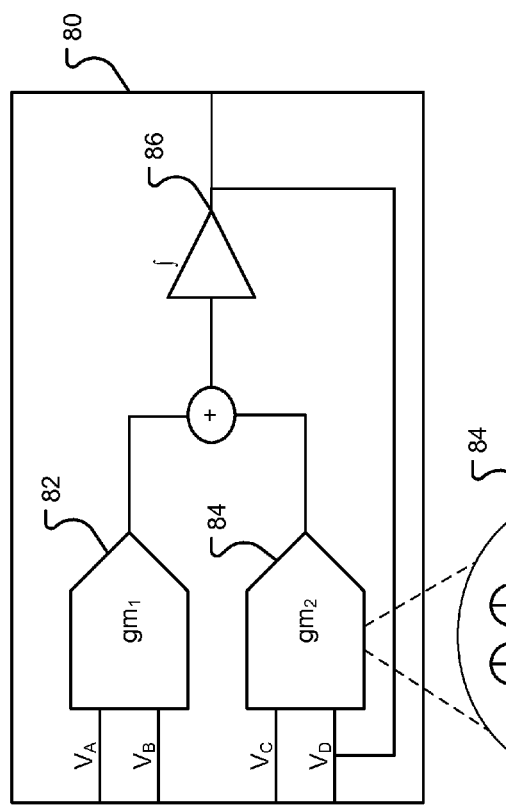
FIG. 9 shows an embodiment of an active feedback amplifier.

In one embodiment, the output amplifier may take the form of an "active feedback amplifier." In the active feedback amplifier shown in FIG. 9, two tranconductance stages 82 and 84 have as their respective inputs $V_A$, $V_B$, $V_C$ and $V_D$. The stages 82 and 84 are configured as shown in the exploded view such that the outputs of $g_{m1}$ and $g_{m2}$ are substantially equal. In order for this to be true, $V_A-V_B=V_D-V_C$. This forces the output to be 'semi-linear' in that the output will be linear for the mid-range of the output graph, having non-linear regions at the edges.

Figure 10:
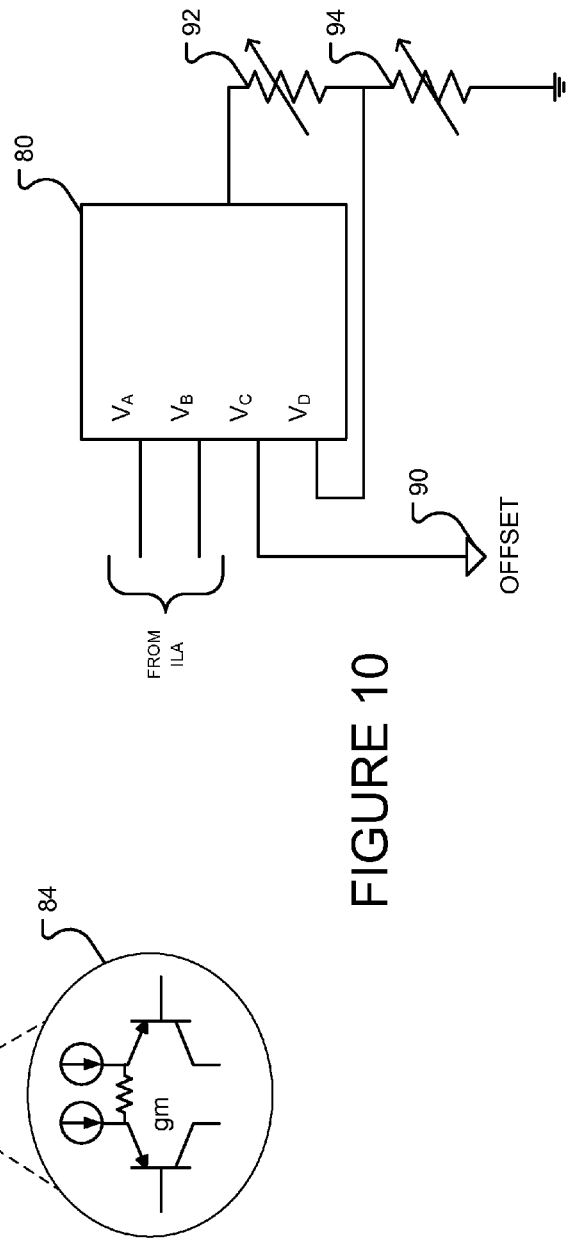
FIG. 10 shows an embodiment of an active feedback amplifier used as part of the output path of a multiplexed ILA.

In the embodiments of the MILA, the use of the active feedback amplifier (AFA) allows the slope of the output to be trimmed to match a particular gain. FIG. 10 shows an example of such an application. The outputs of the ILA front end are connected to $V_A$ and $V_B$. $V_C$ is connected to small voltage offset, and $V_D$ is connected to the output of the AFA through a trimmed resistor 92. In this manner, a small signal swing from the ILA, such as ±600 mV can result in a gain of 2, or an output of ±1.2 V.

In this manner, one can multiplex input current sources. Different embodiments discussed here provide different manners of multiplexing the input current sources, including embodiments where the resulting signal may be more than just a multiplexed signal between two or more options, but can provide a ratiometric signal.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A device, comprising:
   first and second current-mode logarithmic amplifiers having first and second input terminals, respectively, and first and second output terminals, respectively, wherein voltages output at the first and second output terminals are logarithmically related to currents input at the first and second input terminals, respectively; and
   multiplexing logic electrically connected to the first and second output terminals of the first and second current-mode logarithmic amplifiers, respectively, to select one of the first and second current-mode logarithmic amplifiers to produce an output signal, wherein:
   the multiplexing logic includes a first buffer amplifier coupled to the first output terminal, and a second buffer amplifier coupled to the second output terminal,
   the first buffer amplifier has a first control signal terminal, wherein the first buffer amplifier is to 1) in response to receipt of a first control signal at the first control signal terminal, provide an open circuit at the first output terminal, and 2) in response to receipt of a second control signal at the first control signal terminal, provide the voltage output at the first output terminal as the output signal, and
   the second buffer amplifier has a second control signal terminal, wherein the second buffer amplifier is to 1) in response to receipt of a third control signal at the second control signal terminal, provide an open circuit at the second output terminal, and 2) in response to receipt of a fourth control signal at the second control signal terminal, provide the voltage output at the second output terminal as the output signal.

2. The device of claim 1, further comprising first and second photodiodes to provide the currents to the first and second input terminals, respectively.

3. The device of claim 1, wherein the second and third control signals are a same control signal.

4. The device of claim 1, further comprising:
   a first photodiode coupled to an input of the first current-mode logarithmic amplifier, wherein an output of the first photodiode is not multiplexed before being input to the first current-mode logarithmic amplifier.

5. An amplification system, comprising:
   a first current-mode logarithmic amplifier;
   a second current-mode logarithmic amplifier; and
   an amplifier arrangement coupled to outputs of the first and second current-mode logarithmic amplifiers, wherein the amplifier arrangement has an output terminal, and wherein an output at the output terminal corresponds to an output of either the first current mode logarithmic amplifier or an output of the second current-mode logarithmic amplifier based on a control signal;
   wherein a resistor is coupled between a first node and a reference voltage, and wherein the first node is between the output of the first current-mode logarithmic amplifier and the output terminal.

6. The amplification system of claim 5, wherein the amplifier arrangement comprises:
   a first buffer amplifier coupled between the first current-mode logarithmic amplifier and the output; and
   a second buffer amplifier coupled between the second current-mode logarithmic amplifier and the output.

7. The amplification system of claim 6, wherein the first buffer amplifier is to selectively present a high impedance output or an amplification of the output of the first current-mode logarithmic amplifier, based on the control signal.

8. The amplification system of claim 7, wherein the second buffer amplifier is to selectively present a high impedance output or an amplification of the output of the second current mode logarithmic amplifier, based on the control signal, and wherein the first buffer amplifier is not to present the amplification of the output of the first current-mode logarithmic amplifier at the same time that the second buffer amplifier presents the amplification of the output of the second current-mode logarithmic amplifier.

9. The amplification system of claim 7, wherein the amplification of the output of the first current-mode logarithmic amplifier is a unity gain amplification of the output of the first current-mode logarithmic amplifier.

10. The amplification system of claim 5, further comprising:
    a first photodiode coupled to an input of the first current-mode logarithmic amplifier; and
    a second photodiode coupled to an input of the second current-mode logarithmic amplifier.

11. The amplification system of claim 10, wherein the first photodiode is a single photodiode.

12. A method of selectively transmitting photodiode signals, comprising:
    receiving a current from a photodiode at an input of a current-mode logarithmic amplifier;
    receiving a first control signal at an amplifier disposed between the current-mode logarithmic amplifier and an output terminal;
    in response to receiving the first control signal at the amplifier, presenting a high impedance by the amplifier at the output terminal;
    receiving a second control signal at the amplifier; and
    in response to receiving the second control signal at the amplifier, presenting an amplification of the output of the current-mode logarithmic amplifier at the output terminal.

13. The method of claim 12, wherein a resistor is coupled between a node and a reference voltage, and wherein the node is between the current-mode logarithmic amplifier and the amplifier.

14. The method of claim 12, wherein the current is a first current, the photodiode is a first photodiode, the current-mode logarithmic amplifier is a first current-mode logarithmic amplifier, the amplifier is a first amplifier, and the method further comprises:
    receiving a second current from a second photodiode at an input of a second current-mode logarithmic amplifier;
    receiving a third control signal at a second amplifier disposed between the second current-mode logarithmic amplifier and the output terminal; and in response to receiving the third control signal at the second amplifier, presenting a high impedance by the second amplifier at the output terminal;

receiving a fourth control signal at the second amplifier; and in response to receiving the fourth control signal at the second amplifier, presenting an amplification of the output of the second current mode logarithmic amplifier at the output terminal;

wherein the first amplifier is not to present the amplification of the output of the first current-mode logarithmic amplifier at the same time that the second amplifier presents the amplification of the output of the second current-mode logarithmic amplifier.

15. An amplification system, comprising:

a first current-mode logarithmic amplifier;

a first amplifier disposed between the current-mode logarithmic amplifier and an output terminal, wherein the first amplifier is to:
- in response to receipt of a first control signal at the amplifier, present a high impedance at the output terminal, and
- in response to receipt of a second control signal at the first amplifier, present an amplification of an output of the current-mode logarithmic amplifier at the output terminal;

a second current-mode logarithmic amplifier;

a second amplifier disposed between the second current-mode logarithmic amplifier and the output terminal, wherein the second amplifier is to:
- in response to receipt of a third control signal at the second amplifier, present a high impedance at the output terminal, and
- in response to receipt of a fourth control signal at the second amplifier, present an amplification of an output of the second current-mode logarithmic amplifier;

wherein the first amplifier is not to present the amplification of the output of the first current-mode logarithmic amplifier at the same time that the second amplifier presents the amplification of the output of the second current-mode logarithmic amplifier.

16. The amplification system of claim 15, wherein the first and fourth control signals are a same control signal.

17. The amplification system of claim 15, wherein the amplification of the output of the current-mode logarithmic amplifier is a unity gain amplification of the output of the current-mode logarithmic amplifier.

18. The amplification system of claim 15, wherein a resistor is coupled between a node and a reference voltage, and wherein the node is between the output of the first current-mode logarithmic amplifier and the output terminal.

19. The amplification system of claim 15, wherein the first and second control signals are select and deselect signals, respectively.

* * * * *